United States Patent [19]

Chakradhar et al.

[11] Patent Number: 6,018,813

[45] Date of Patent: *Jan. 25, 2000

[54] IDENTIFICATION AND TEST GENERATION FOR PRIMITIVE FAULTS

[75] Inventors: Srimat T. Chakradhar, North Brunswick, N.J.; Kwang-Ting Cheng, Santa Barbara, Calif.; Angela Krstic, Germantown, Md.

[73] Assignee: NEC USA, Inc., Princeton, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/837,561

[22] Filed: Apr. 21, 1997

[51] Int. Cl.$^7$ .................................................. G01R 31/28
[52] U.S. Cl. .............................................................. 714/724
[58] Field of Search ................................ 371/22.1, 22.31, 371/22.33, 27.1, 27.5, 57.1; 395/183.01, 183.06, 183.16, 183.04; 714/724, 726, 728, 733, 734, 738, 742, 811, 25, 28, 30, 40

[56] References Cited

U.S. PATENT DOCUMENTS

| | | | |
|---|---|---|---|
| 5,365,528 | 11/1994 | Agrawal et al. | 714/736 |
| 5,422,891 | 6/1995 | Bushnell et al. | 714/732 |
| 5,583,787 | 12/1996 | Underwood et al. | 371/22.36 |
| 5,675,728 | 10/1997 | Kunda et al. | 714/28 |

OTHER PUBLICATIONS

W. Ke et al, "Delay–Verifiability of Combinational Circuits Based on Primitive Faults", Proceedings of the IEEE International Conference on Computer Design, pp. 86–90, Oct. 1994.

A. Krstic et al, "Generation of High Quality Tests for Functional Sensitizable Paths", Proceedings of 13$^{th}$ VLSI Test Symposium, pp. 374–379, May 1995.

U. Sparmann et al, "Fast Identification of Robust Dependent Path Delay Faults", Proceedings of the 32$^{nd}$ Design Automation Conference, pp. 119–125, Jun. 1995.

KT Cheng et al, "Delay Testing for Non–Robust Untestable Circuits", Proceedings of IEEE International Test Conference, pp. 954–961, Oct. 1993.

*Primary Examiner*—Trinh L. Tu
*Attorney, Agent, or Firm*—Sughrue, Mion, Zinn, Macpeak & Seas, PLLC

[57] ABSTRACT

A method to identify and test primitive faults in combinational circuits described as multi-level or two-level netlists. A primitive fault is a multiple path delay for which none of the single paths contained in the fault is robustly or non-robustly testable while the presence of the fault will degrade the circuit performance. Identification and testing of primitive faults is important for at least two reasons: (1) a large percentage of paths in production circuits remain untestable under the single-path delay fault model, (2) distributed manufacturing defects usually adversely affect more than one path and these defects can be detected only by analyzing multiple affected paths. The single-path delay faults contained in a primitive fault have to merge at some gate(s). The methodology for identifying primitive faults can quickly (1) rule out a large number of gates as possible merging points for primitive faults, and (2) reduce or prune the combination of paths that can never belong to any primitive fault. The procedure for identifying a primitive fault also produces a test for the fault. A complete algorithm is presented for identifying and testing double path delay faults. A similar procedure can be used to identify primitive faults consisting of three or more paths. Experimental results on several multi-level combinational benchmark circuits are included to demonstrate the usefulness and efficiency of the technique.

8 Claims, 6 Drawing Sheets

IDENTIFICATION AND TEST GENERATION FOR PRIMITIVE FAULTS

BACKGROUND OF THE INVENTION

1. Field of the Invention

The present invention relates generally to a method for identification and test generation for primitive faults, and more particularly pertains to identification and test generation for primitive faults in multi-level or two-level netlists combinational circuits.

Increasing circuit operating frequencies and demands for low cost and high quality require that the temporal correctness of a circuit can be guaranteed. For high performance circuits with aggressive timing requirements, small process variations can lead to failures at the design clock rate. These defects can stay undetected after at-speed or stuck-at-fault testing. To detect them, the design has to be subjected to delay testing.

2. Discussion of the Prior Art

A path delay fault model is frequently used in delay testing for detecting distributed manufacturing defects. In this model a circuit is considered faulty if the propagation delay of any of its paths exceeds the clock period. A path in a combinational circuit is an ordered set of gates $g_0, \ldots, g_n$ where $g_0$ and $g_n$ are a primary input and output, respectively, and gate $g_i$ is an input to gate $g_{i+1}$ ($0 \leq i \leq n-1$). A delay defect on a path can be observed by propagating a transition through the path. This requires application of a two-vector test, $V = <v_1, v_2 \leq$. Therefore, a path delay fault specification consists of a physical path and a transition that will be applied at the beginning of the path.

Figure 1:
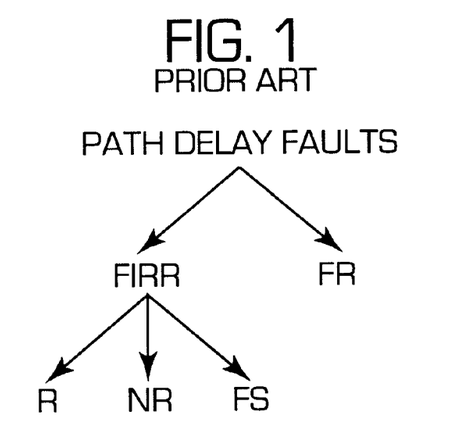
FIG. 1 illustrates a path delay fault classification systems.

Research on path delay fault testing shows that there are several different path delay fault classes. Defects on robustly (R) testable paths are guaranteed to be detected regardless of delays on the other signals in the circuit. Defects on non-robustly (NR) testable paths can be detected if transitions on certain signals outside the target path are not late. Functional sensitizable (FS) path delay faults may degrade the circuit performance if several path delay faults simultaneously occur. Functional redundant (FR) paths can never determine the performance of the circuit and they do not have to be tested. Paths that can affect the performance of the circuit (robust, non-robust and functional sensitizable paths) are together called functional irredundant (FIRR) paths. FIG. 1 illustrates the path delay fault classification system.

Testing strategies exist for robust and non-robust path delay faults. However, usually only a small portion of functional irredundant path delay faults can be tested under the robust and non-robust criteria. On the other hand, the set of functional sensitizable faults can be very large. Functional sensitizable paths are false paths if no other path delay faults simultaneously exist in the circuit. However, if some other path delay fault is present at the same time, functional sensitizable faults can become true paths and can determine the performance of the circuit. Typically, a number of different tests have to be applied to guarantee that a given FS path is delay fault-free. This is because a given FS path can belong to many different groups of paths that can together affect the performance of the circuit. An FS path is thoroughly tested by some test set T if after applying T it can be guaranteed that the target path is delay fault free. In the publication by W. Ke and P. R. Menon, Delay-Verifiability of Combinational Circuits Based on Primitive Faults, Proceedings of IEEE International Conference on Computer Design, pages 86–90, October 1994, a special class of multiple path delay faults called primitive faults has been introduced. It is known that testing all primitive faults would result in a thorough testing of all FS paths.

Testing of FS paths has been addressed by several research groups. However, no practical method has been proposed for testing of these faults in circuits described as multi-level netlists. This is because (1) testing of FS paths requires developing testing strategies for some multiple fault conditions and (2) identification of the conditions under which the fault on some FS path can be detected is a complex task.

Figure 2:
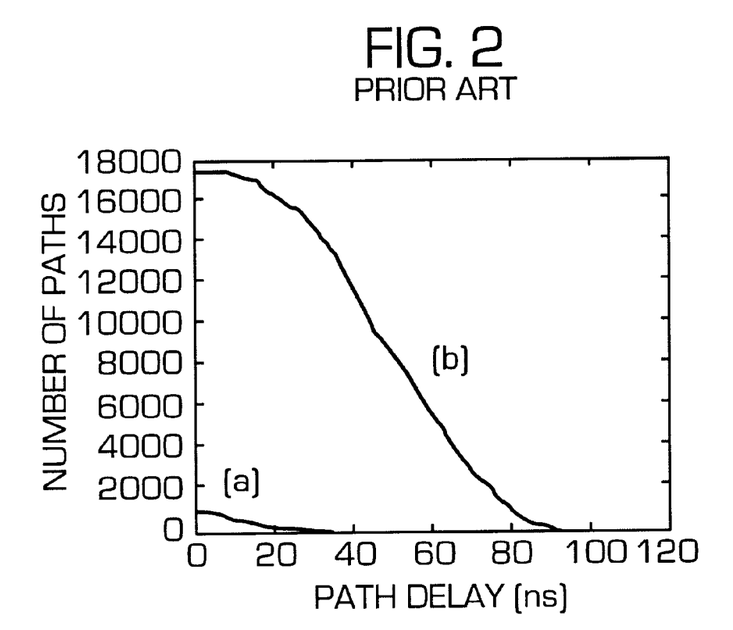
FIG. 2 shows the distribution of delay paths for a fully scanned and mapped S1269 for (1) robustly and non-robustly testable paths (graph(a)) and (2) functional sensitizable paths (graph(b))

In delay testing, the inability to generate tests for some multiple path delay faults can lead to a poor delay test quality. This is unlike stuck-at fault testing wherein tests developed under single fault assumption can offer high fault coverage. For example, consider circuit s1269 from the ISCAS 89 set of benchmarks. Fully scanned and mapped into 2-input gates this circuit has a total of 79,138 paths. The number of all functional irredundant paths is 18,506. Only 5.4% of the functional irredundant paths are robustly or non-robustly testable while 94.6% are functional sensitizable. FIG. 2 shows the number of paths with delay longer than the corresponding path delay for (1) robustly and non-robustly testable paths (graph (a)) and (2) functional sensitizable paths (graph (b)). The delays are obtained from a timing analyzer. The longest robust or non-robust path has a delay of 43.5 ns while the longest functional sensitizable path has a delay of 105.3 ns. Therefore, the robust and non-robust test set can detect only path defects whose total size is more than twice the delay of the path. Small manufacturing defects might not result in such large delay defects. However, they can cause a small delay increase on more than one long path. In circuits like this one, such defects could be detected only be testing functional sensitizable paths.

SUMMARY OF THE INVENTION

Accordingly, it is a primary object of the present invention to provide a method for identification and test generation for primitive faults, in multi-level or two-level netlists combinational circuits.

In accordance with the teachings herein, the present invention provides a method for identifying and testing primitive faults in multi-level or two-level netlists combinational circuits wherein a primitive fault is a multiple path delay fault for which none of the single paths contained in the fault is robustly or non-robustly testable while the presence of the fault will degrade the circuit performance. A path in the combinational circuit is an ordered set of gates $g_0, \ldots, g_n$ where $g_0$ and $g_n$ are a primary input and primary output respectively, and gate $g_i$ is an input to gate $g_i+1$ ($0 \leq i \leq n-1$). Functional sensitizable (F3) path delay faults may degrade the circuit performance if several path delay faults occur simultaneously. An input to a gate is determined to have a controlling value (denoted cv) if it determines the value of the gate output regardless of the values on other fanins to the same gate. If the value on some input is a complement of the controlling value, the input is said to have a non-controlling value (denoted ncv). Gates that could possibly be merging points in a primitive fault are denoted co-sensitizing gates, gates on which no merging of functional sensitizable (FS) paths to form a primitive fault is possible are denoted non-co-sensitizing gates, and the cardinality is the number of paths in a primitive fault.

The method comprises the following steps:

a. identify those gates that can never be the gates where paths involved in any primitive fault merge by using information about the number of functional sensitizable paths that go through each signal in the circuit;

b. examine each functional sensitizable path and determine the primitive faults which include that path;

c. using the information about functional sensitizable paths which do not require testing, update the number of controlling value-functional sensitizable (cv-FS) paths through each signal by eliminating from testing those paths that do not have any co-sensitizing gate; and d. update the number of controlling value-functional sensitizable (cv-FS) paths through each signal through several iterations.

In greater detail, a transition in which the value of some input changes from the controlling to the non-controlling value is denoted cv→ncv, and similarly for a ncv→cv transition. A signal is an on-input of path P if it is on P, and a signal is an off-input of path P if it is an input to a gate in P but it is not an on-input signal. To find a co-sensitized path which together with path P form a primitive fault of cardinality 2, explore only partial paths associated with an off-input t, and assign a non-controlling value to all off-inputs to P other than off-input t and a ncv→cv transition to off-input t.

The cardinality of a co-sensitizing gate is defined as the sum of the number of cv-FS paths passing through the inputs to the gate. Then for a primitive fault of cardinality k>2, if the number of cv-FS paths through each input of a co-sensitizing gate g is known, then derive the upper bound on the number of primitive faults of cardinality k ($k \geq 2$) such that g is a merging point. A necessary condition for the existence of a primitive fault of cardinality k>2 that includes FS path P is that there exists at least one co-sensitizing gate g in P such that (1) the cardinality of the co-sensitizing gate is higher than or equal to k and (2) gate g is a co-sensitizing gate with respect to primitive faults of cardinality k.

To find the primitive faults of cardinality k, first find the primitive faults of cardinality k−1. To find the primitive faults of cardinality k, use information about the number of primitive faults of cardinality k−1 at each co-sensitizing gate. The necessary conditions for existence of a primitive fault of cardinality k for some FS path are that (1) there exists at least one co-sensitizing gate g of cardinality equal or higher than k, and (2) gate g is a co-sensitizing gate with respect to primitive faults of cardinality k, which means that the number of primitive faults of cardinality k−1 at g is not equal to the upper bound on this number for gate g.

A delay defect on a path is observed by propagating a transition through the path, which requires application of a two-vector test, $V=(v_1, v_2)$ and a path delay fault specification consists of a physical path and a transition that is applied at the beginning of the path. A multiple path II is defined as a set of single paths that end at the same primary output. A multiple path delay fault (MPDF) on II is defined as a condition under which every single path in II has a fault. A signal is an on-input of a multiple path II if it is on II, and a signal is an off-input of a multiple path II on-input. An MPDF on II is static sensitizable if there exists a pair of vectors that launches the required transitions on all primary inputs in II and the final value of each off-input of II is non-controlling. A primitive fault is defined as a multiple delay fault that satisfies the following two conditions, (1) it is static sensitizable, and (2) no proper subset of this MPDF is static sensitizable. Cardinality of a primitive fault represents the number of SPDF in the given MPDF. For a given path delay fault, the set of signal values that have to be assigned in order for a test to exist is called a set of mandatory assignments (SMA).

The algorithm for identifying primitive faults of cardinality 2 consists of two parts:

a. collect information about the co-sensitizing gates and FS paths which need to be tested, which involves the following steps;

i. identify the co-sensitizing gates with respect to the given primary output PO, which requires knowledge about the number of FS paths passing through each signal, which gives the upper bound on the number of cv-FS and ncv-FS paths through each signal, and therefore the number of co-sensitizing gates is also an upper bound;

ii. for each FS path, further refine the information about co-sensitizing gates by finding the co-sensitizing gates for the target FS path;

iii. find all FS paths which do not have any co-sensitizing gates and do not need to be tested, and update the number of cv-FS and ncv-FS paths through the signals in the circuit;

iv. reduce the test set size by repeating steps i→iii through several iterations;

b. use the knowledge about co-sensitizing gates to find primitive faults of cardinality 2 for each FS path, wherein a necessary condition for the existence of a primitive fault of cardinality 2 for an FS path P is that there exists at least one co-sensitizing gate in P, and find the primitive faults of cardinality 2 for an FS path P as follows:

i. identify the co-sensitizing gates for P;

ii. for a co-sensitizing gate $g \in P$, assign ncv→cv transition to the on-input m and to one additional input n to gate g, wherein the number of cv-FS paths through n is non-zero, all off-inputs feeding the co-sensitizing gates in P other than the off-input n are assigned a non-controlling value under vector $v_2$, to prevent the cardinality of the primitive fault from exceeding 2;

iii. explore the partial paths from n to any principle input PI to find a co-sensitizing path that together with P forms a primitive fault of cardinality 2, the partial path from n to the given PI must be statically sensitizable under a current SMA and contained in some FS path, identify segments in the input cone of signal n for which, under the current SMA, no static sensitizable path can pass through, use the information about the number of cv-FS and ncv-FS paths passing through each signal to reduce the search for the partial path, once a partial path to PI is found, check if the path co-sensitized with P at gate g is functional sensitizable, if yes, a primitive fault of cardinality 2 is found, and the search continues until all statically sensitizable partial paths from n to any principle input PI are found;

iv. Repeat steps i→iii for any input n feeding any co-sensitizing gate $g \in P$.

BRIEF DESCRIPTION OF THE DRAWINGS

The foregoing objects and advantages of the present invention for identification and test generation for primitive faults may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

The present invention relates generally to a method for identification and test generation for primitive faults in multi-level or two level netlists combinational circuits. Such circuits have primary inputs and outputs which are respectively not preceded by and succeeded by gates, and the level of the circuits is the number of gates between the primary inputs and outputs.

The present invention is the result of investigations on strategies for thorough testing of functional sensitizable faults for multi-level combinational circuits. A new method is disclosed for identifying the multiple fault conditions under which a given FS path can affect the performance of the circuit (i.e., primitive faults containing the target FS path), and (2) a test generation strategy for primitive faults. The single-path delay faults involved in a primitive fault have to merge at one or more gates in the circuit.

The present invention identifies primitive faults by the following key steps. First identify a list of gates that can never be the gates where paths involved in any primitive fault merge. These gates are identified using information about the number of FS paths that go through each signal in the circuit. Then examine each functional sensitizable path and determine the primitive faults that include this path. The procedure for identifying a primitive fault also produces a test for the fault. Several techniques are presented to (1) significantly reduce the set of gates that can be the merging points for any primitive fault, and (2) to quickly prune combinations of paths that can never belong to any primitive fault.

The test generation effort and test set size for thorough testing of the FS paths depend on the number of tested FS paths. The method for finding primitive faults that contain a given FS path does not depend on the specific set of FS paths that are selected for testing. Therefore, the method can be combined with different techniques for FS path selection. A recent technique selects a smaller set of FS paths whose testing, along with testing of robust and non-robust faults, is sufficient to guarantee the prespecified performance of the circuit. The set of FS paths for testing can be also selected based on the path delay as reported by a timing analyzer.

2. Definitions

An input to a gate is said to have a controlling value (denoted cv) if it determines the value of the gate output regardless of the values on the other fanins to the same gate. If the value on some input is a complement of the controlling value, the input is said to have a non-controlling value (denoted ncv). A transition in which the value of some input changes from the controlling to the non-controlling value is denoted cv→ncv and similarly, for a ncv→cv transition. A signal is an on-input of path P if it is on P. A signal is an off-input of path P if it is an input to a gate in P but it is not an on-input signal.

For a given path delay fault, the set of signal values that have to be assigned in order for a test to exist is called set of mandatory assignments (SMA). Different techniques for computing SMA for a target fault result in a smaller or larger SMA. For a given input vector pair, the condition under which a given target fault is being tested depends on the transitions produced on the path's on- and off-inputs. A path P is said to be static sensitizable if there exists at least one input vector pair V=<$v_1,v_2$≦ such that all the off-inputs in P settle on their non-controlling values under $v_2$. For a given path and given test V, an off-input that has a ncv→cv transition when the corresponding on-input has a ncv→cv transition is called FS of-input.

Figure 3A:
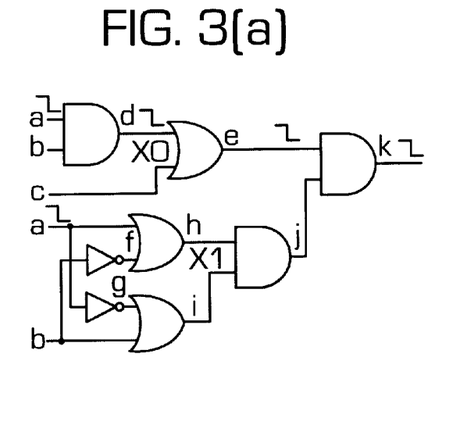
FIG. 3 is a circuit which illustrates that an FS path under any vector pair that can launch and propagate a transition through the path must have at least one FS off-input, the rest of the off-inputs can be assigned a non-controlling value under vector $v_2$, and therefore, an FS path is not static sensitizable.
Figure 3B:
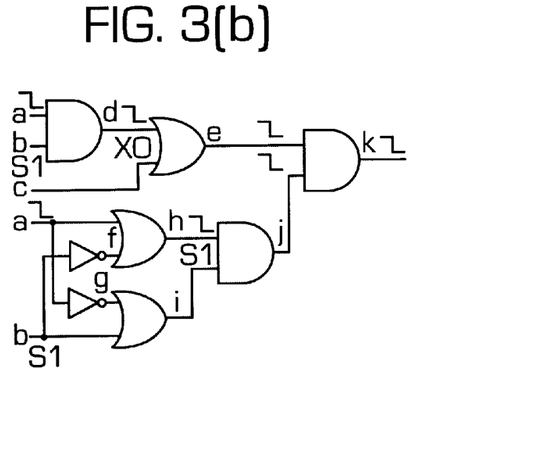

An FS path that propagates a transition to a primary output PO must have at least one FS off-input. The rest of the off-inputs can be assigned a non-controlling value under vector $v_2$. Therefore, an FS path is not static sensitizable. For example, consider the circuit in FIG. 3. The SMA for the path {adek, falling} is shown in FIG. 3(a). Under any input vector pair V there must be one FS off-input in the target path off-input b (for b=0) or off-input j (for b=1). Therefore, the target path is a functional sensitizable path delay fault. For each FS off-input there must exist one or more partial paths from PI through which the ncv→cv transition can reach the FS off-input. These paths are said to be associated with the given FS off-input. For example, under the input vector pair shown in FIG. 3(b), off-input j is an FS off-input for the target path {adek, falling} and partial path {ahj, falling} is associated with the FS off-input j. The value of signal k in the target path is determined by the earliest arriving input. Therefore, in order to detect a fault on the target FS path, the transition on the FS off-input j must also be late.

A multiple path Π is defined as a set of single paths that end at the same primary output. A multiple path delay fault (MPDF) on Π is defined as a condition under which every single path in Π has a fault. A signal is an on-input of a multiple path Π if it is on Π. Therefore, a multiple path delay fault can have a gate that has several inputs that are on-inputs (multiple on-input). A signal is an off-input of a multiple path n if it is an input to a gate in Π but it is not an on-input. An MPDF on Π is said to be static sensitizable if there exists a pair of vectors that launch the required transitions on all primary inputs in Π and the final value of each off-input of Π is non-controlling. For example, the two single-path delay faults shown in bold face in FIG. 3(b) form a multiple path delay fault. Gate k has a multiple on-input consisting of two signals, e and j. This MPDF is static sensitizable. Each single-path delay fault (SPDF) can be regarded as an MPDF containing only one faulty path.

Definition of primitive faults.

Figure 4A:
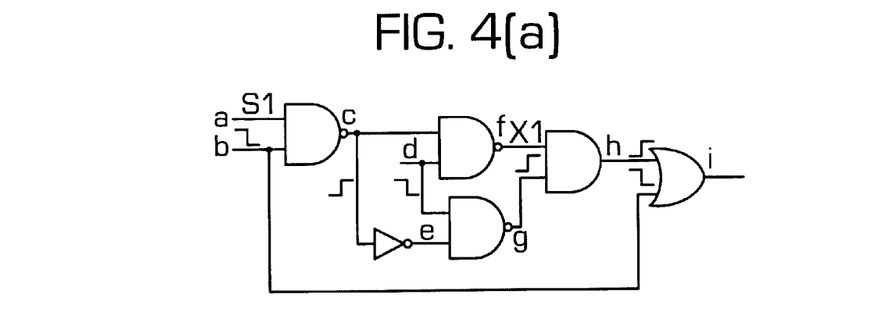
FIG. 4 is a circuit which illustrates that paths in a primitive fault are co-sensitized at the merging points, for example, faults $P_1$={bceghi, falling} and $P_2$={dghi, falling} are functional sensitizable faults, and wherein the test shown in FIG. 4(a) co-sensitizes these two faults at gate g (this gate has a multiple on-input consisting of two signals), the MPDF $II_1$={$P_1, P_2$} is a primitive fault of cardinality 2 and gate g is the merging point, the test shown in FIG. 4(b) involves three FS paths $II_2$={$P_1, P_2, P_3$} and they merge at gates c and g.
Figure 4B:
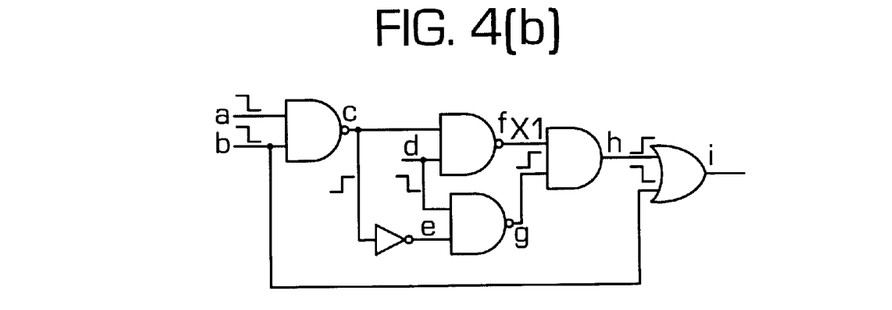

A primitive fault is defined as a multiple delay fault that satisfies the following two conditions: (1) it is static sensitizable and (2) no proper subset of this MPDF is static sensitizable. Cardinality of a primitive fault represents the number of SPDF in the given MPDF. Robust and non-robust path delay faults satisfy the above two conditions and can be regarded as primitive faults of cardinality 1. Since functional sensitizable faults are not static sensitizable they do not satisfy the first condition for primitive faults. However, several FS paths together can form a primitive fault. All single paths in a primitive fault end at the same primary output. Therefore, a primitive fault of cardinality higher than 1 must have at least one gate with a multiple on-input. Such gates are called merging points of the primitive fault. All signals in a multiple on-input must be assigned ncv→cv transition. Paths in a primitive fault are co-sensitized at the merging points. For example, consider the circuit in FIG. 4. Faults $P_1=\{bceghi, falling\}$ and $P_2=\{dghi, falling\}$ are functional sensitizable faults. The test shown in FIG. 4(a) co-sensitizes these two faults at gate g (this gate has a multiple on-input consisting of two signals). The MPDF $\Pi_1=\{P_1, P_2\}$ is a primitive fault of cardinality 2 and gate g is the merging point. If both single paths ($P_1$ and $P_2$) are faulty, the test for $\Pi_1$ will make this fault observable at the primary output. Fault $P_3=\{aceghi, falling\}$ is also an FS fault. The test shown in FIG. 4(b) involves three FS paths $\Pi_2=\{P_1, P_2, P_3\}$ and they merge at gates c and g. However, $\Pi_2$ is not a primitive fault because it does not satisfy the second necessary condition for primitive faults (since $\Pi_1 \subset \Pi_2$). To explain this necessary condition, consider first that the circuit has passed the test for $\Pi_1$. It means that at least one of the single-path delay faults ($P_1$ or $P_2$) is not faulty. Let path $P_1$ be faulty and path $P_2$ be delay fault free. The test for $\Pi_2$ cannot detect the fault on $P_2$, because it requires that paths $P_1$ and $P_3$ are faulty together with $P_2$. Therefore, if a test for $\Pi_1$ cannot detect the fault in the circuit, neither can the test for $\Pi_2$. Next, consider that the circuit did not pass the test for $\Pi_1$. In this case, the circuit will be classified as delay-defective and no testing of $\Pi_2$ is required.

Under the condition that there exists a multiple delay fault in the circuit, the test for a primitive fault can be considered a robust test for the set of co-sensitized functional sensitizable paths. This means that a particular MPDF is guaranteed to be detected with a single input vector pair.

3 Prior Work

To thoroughly test a given FS path, all primitive faults containing this path have to be identified and tested. Ke and Menon, in Delay-Verifiability of Combinational Circuits Based on Primitive Faults, Proceedings of IEEE International Conference on Computer Design, pages 86–90, October 1994, propose a technique for identifying and testing primitive faults in two-level combinational circuits. Using their technique it is possible to synthesize a two-level circuit such that all faults in the circuit are primitive. Applying algebraic transformations to a two-level circuit a multi-level circuit can be obtained. The test set generated for the two-level circuit can also detect all primitive faults in this multi-level circuit. However, multi-level circuits obtained using only algebraic transformations are not practical since they have a large area overhead. Multi-level circuits obtained using only algebraic transformations are not area-efficient and synthesis tools usually use various Boolean transformations for area/performance/power optimization.

A given FS path can be tested with many different tests. Some tests have a higher probability to detect a fault on the target FS path than the others. Krstic and Cheng, in Generation of High Quality Tests for Functional Sensitizable Paths, Proceedings of 13th VLSI Test Symposium, pages 374–379, May 1995, propose a technique to generate one test for each target FS path. Timing information is used to ensure that the generated test has a high probability to detect a fault on the target FS path. The technique can be applied to multi-level combinational circuits. Even though this methodology can be extended for thorough testing of FS paths, in practice it might be computationally expensive.

Recent research published by Sparmann, et al., Fast Identification of Robust Dependent Path Delay Faults, Proceedings of 32nd Design Automation Conference, pages 119–125, June 1995, shows that not all of the functional sensitizable path delay faults have to be tested in order to guarantee the prespecified performance of the circuit. Identification of a smaller set of FS paths that need to be tested results in a reduced test generation effort and may lead to a large reduction in test set size and test application time. Sparmann, et al. propose a technique that can rule out for testing some of the FS paths. Defects on these paths are covered by tests for other path delay faults. Testing of the identified set of FS paths has not been addressed.

4 Identification and Testing of Primitive Faults

In any primitive fault that has more than 1 path, none of the individual paths are robustly or non-robustly testable. All the individual paths are functional sensitizable. Since, one objective is thorough testing of FS paths, we concentrate only on primitive faults with two or more paths. Therefore, in the sequel, "primitive fault" refers to primitive faults of cardinality higher than 1. Also, to facilitate easier understanding of the rest of the paper, for a given signal s, we distinguish two kinds of FS paths ending at the same primary output: (1) FS paths that pass through s with a controlling value under vector $v_2$ (cv-FS paths through s) and (2) FS paths that pass through s with a non-controlling value under $v_2$ (ncv-FS paths through s). The methodology is explained assuming that the circuit contains only 2-input gates. Extension of the technique to circuits containing gates with arbitrary numbers of inputs is straightforward. Multiple output circuits are handled by processing each primary output and its fanin cone separately.

4.1 Co-sensitizing gates

A primitive fault must have at least one merging gate. If we identify gates that can never be the merging points for any primitive fault, then we can significantly reduce the effort required to identify and test primitive faults. This is especially true if the number of non-merging gates represents a significant fraction of the total number of gates in the circuit. Gates that could possibly be merging points in some primitive fault are called co-sensitizing gates. Gates on which no merging of FS paths to form a primitive fault is possible are called non-co-sensitizing gates. A gate can be a co-sensitizing gate with respect to one PO but it can be a non-co-sensitizing gate with respect to some other PO.

Definition 1

A gate g is a co-sensitizing gate if the number of cv-FS paths passing through both of its inputs is larger than zero.

Figure 5:
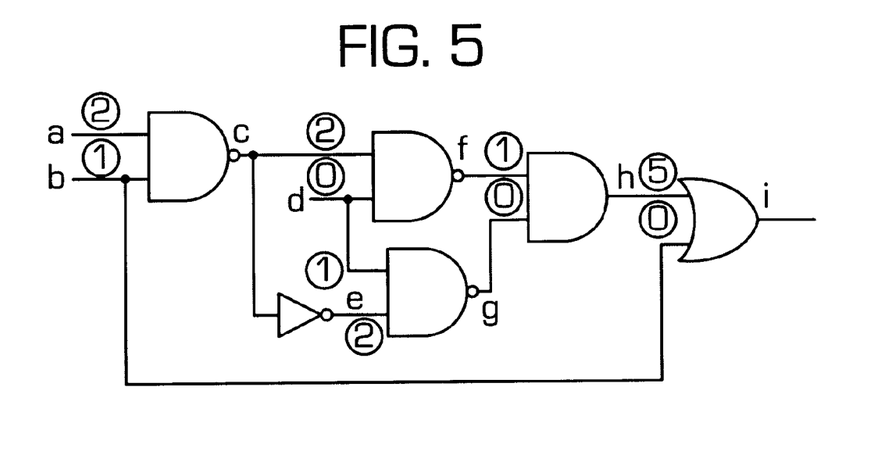
FIG. 5 illustrates an exemplary circuit having a total of six functional sensitizable paths: $P_1$={aceghi, falling}, $P_2$={dghi, falling}, $P_3$={acfhi, falling}, $P_4$={acfhi, rising}, $P_5$={bcfhi, rising} and $P_6$={bceghi, falling}, wherein the circled numbers adjacent to each signal show the number of cv-FS paths through that signal.

If an input s to some gate g has no cv-FS paths passing through it, all paths passing through s with a controlling value under vector $v_2$ and ending at the given PO are either robust, non-robust or functional unsensitizable. Therefore, input s cannot be part of any primitive fault. For example, consider the circuit given in FIG. 5. There is a total of six functional sensitizable paths: $P_1$={aceghi, falling}, $P_2$={dghi, falling}, $P_3$={acfhi, falling}, $P_4$={acfhi, rising}, $P_5$={bcfhi, rising} and $P_6$={bceghi, Falling}. The circled numbers adjacent to each signal show the number of cv-FS paths through that signal. Gates f, h and i do not satisfy the condition given by Definition 1 to be co-sensitizing gates. The only co-sensitizing gates in this example are c and g. In a multiple output circuit, a gate can be a co-sensitizing gate with respect to one PO but it can be a non-co-sensitizing gate with respect to some other PO. Also, note that for circuits containing gates with arbitrary numbers of inputs, a co-sensitizing gate must have at least two inputs with non-zero number of cv-FS paths.

Figure 6A:
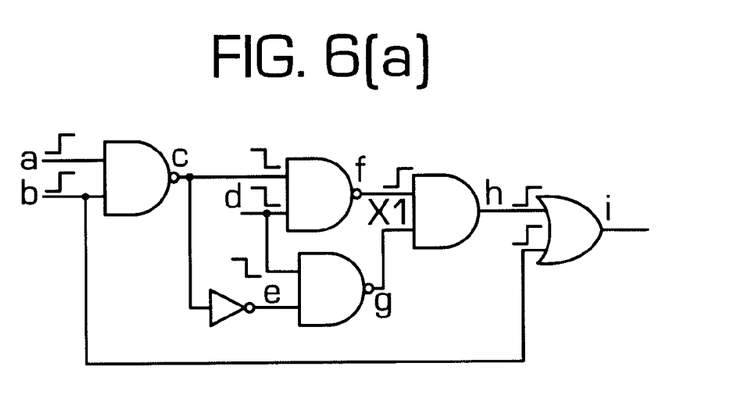
FIG. 6 is a circuit which illustrates several refinement conditions and wherein in the circuit of FIG. 6(a) gate c is a co-sensitizing gate with respect to the primary output, the logic in FIG. 6(b) is part of some larger circuit.
Figure 6B:
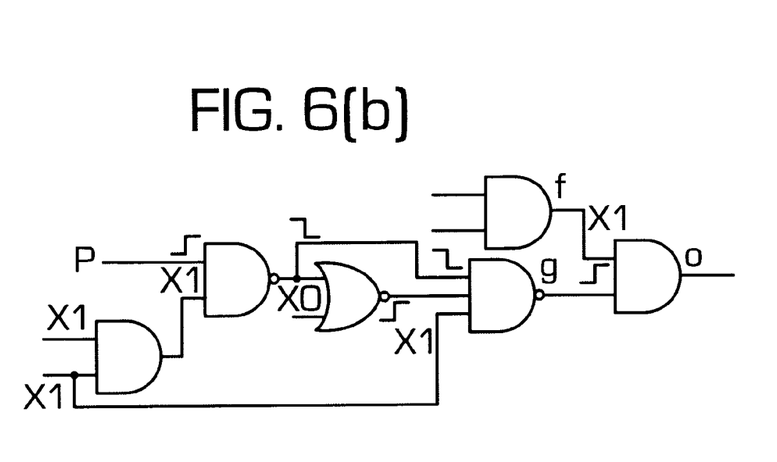

The condition given by Definition 1 identifies co-sensitizing gates for any FS path in the fanin cone of the given primary output. To find the primitive faults that a given FS path is involved in, the information about co-sensitizing gates can be further refined. We illustrate several refinement conditions through examples. In the circuit in FIG. 6(a) gate c is a co-sensitizing gate with respect to the primary output. Let the FS path for which we are trying to find the primitive faults be $P_4$={acfhi, rising}. Under the SMA for $P_4$ the transition on the input a to gate c does not have a controlling value under vector $v_2$. Gate c cannot be a merging point of any primitive fault containing path $P_4$. Therefore, gate c is not a co-sensitizing gate for path $P_4$. Next, assume that the logic in FIG. 6(b) is a part of some larger circuit. Let path P be the target FS path and gates g and f be the co-sensitizing gates with respect to the primary output o. Gate g is the last co-sensitizing gate in P (closest to the primary output). No gate outside the fanin cone of gate g can be a co-sensitizing gate under the SMA for P. Therefore, gate f is not a co-sensitizing gate under the SMA for path P. Also, since under the SMA for P all of the off-inputs to gate g are assigned a non-controlling value under vector $v_2$, gate g is not a co-sensitizing gate for path P.

In this refinement process, some of the co-sensitizing gates with respect to a given PO might become non-co-sensitizing with respect to the target path. However, all of the non-co-sensitizing gates with respect to the given PO will stay non-co-sensitizing with respect to any target FS path ending at that PO. Note that the technique does not depend on the way the SMA is computed. A larger SMA can only result in a larger reduction in the number of co-sensitizing gates for a given FS path and, therefore, in a reduced search space for primitive faults containing this path. It does not affect the final outcome of the procedure (i.e., the total number of primitive faults that include the FS path).

4.2 Merging gates

There are several reasons why a given co-sensitizing gate might not be a merging point. First, computing the exact number of cv-FS paths through each signal in the circuit can be prohibitively expensive since it requires consideration of two vectors <$v_1$ and $v_2$>. Approximate values for the number of cv-FS paths through each signal can be efficiently computed by using only the information about the second vector $v_2$. However, these numbers are pessimistic in the sense that a functional redundant path may be counted as an FS path. On the other hand, FS paths can never be misclassified. Second, even if the cv-FS path count can be computed exactly, the information about the number of cv-FS paths passing through the inputs to a co-sensitizing gates does not take into account any correlations between these paths. Correlations between the FS paths can be temporal or spatial. Temporal correlations are manifested by a co-sensitizing gate for which the cv-FS paths cannot pass through together under any input vector pair. Spatial correlations are manifested by a co-sensitizing gate for which a multiple delay fault involving only FS paths exists, but it is a superset of some primitive fault (FIG. 4(b)). One simple way to account for some of the temporal correlations between the paths passing through a given co-sensitizing gate is to assign ncv→cv transition to both of its inputs and to find the forward and backward implications of this assignment. If a conflict is detected the gate can be marked as a non-co-sensitizing gate.

Note that the technique does not depend on the accuracy with which the cv-FS values are computed. Using approximate methods for path classification as well as ignoring correlations between FS paths only results in a larger number of co-sensitizing gates which then implies longer search time for primitive faults. It does not affect the final outcome of our procedure (i.e., the total number of primitive faults that include the FS path).

4.3 Identifying FS paths not involved in any primitive fault

Given that all robust and non-robust path delay faults are selected for testing, not all of the FS paths have to be tested to guarantee the prespecified performance of the circuit. If an FS path P under the SMA does not have any co-sensitizing gate, path P does not have to be tested. Faults on such FS paths can be detected by testing some other paths. For example, consider again the circuit in FIG. 6(a). The set of mandatory assignments and their implications for the functional sensitizable path $P_4$={acfhi, rising} is as shown. Under this SMA there are no co-sensitizing gates in the target path and the target path does not have to be tested. The fault on the target path can be observed only if paths {dfhi, falling} and {bi, rising} are also faulty. However, both of these paths are robustly testable and if any of them is faulty the robust test set will detect the fault. Similarly, we can determine that path $P_5$={bcfhi, rising} does not have any co-sensitizing gates and it does not need to be tested. Using the information about FS paths which do not require testing, we can update the number of cv-FS paths through each signal. For example, since paths $P_4$ and $P_5$ pass through signals c and h with a controlling value but do not have to be tested, the number of cv-FS paths through signals c and h reduces by 2. The updated values for cv-FS paths are shown as circled numbers adjacent to each signal in FIG. 7. The process of eliminating from testing those FS paths that do not have any co-sensitizing gate and updating the number of cv-FS paths through each signal can be repeated through several iterations. However, there exist FS paths that do not have to be tested but cannot be identified by examining only the number of co-sensitizing gates. An example is the FS path $P_3$={achi, falling} in the circuit in FIG. 7. It has one co-sensitizing gate (gate c) but it can be co-sensitized with a robust path {bcfhi, falling}.

4.4 Algorithm for identification and test generation for primitive faults of cardinality 2

A given FS path can participate in many primitive faults. The cardinality k of these primitive faults can be anywhere from 2 up to some number M. To guarantee that a fault on an FS path will not affect the performance of the circuit, all primitive faults of cardinality higher than or equal to 2 have to be identified and tested. Suppose that a circuit has passed the robust and non-robust test. In this circuit, in order for a primitive fault of cardinality k to be responsible for the performance degradation, it is necessary that a multiple delay fault happens on all k FS paths and on none of the robust or non-robust paths. The probability of such an event in circuits that have long robust or non-robust paths, for primitive faults of high cardinality (k higher than 2 or 3), is very low. Even for circuits in which most (or all) of the long paths are functional sensitizable paths, the probability that k long paths will simultaneously be affected by defects significantly reduces as k increase. Therefore, identification and testing of primitive faults of low cardinality is of the highest significance.

To identify primitive faults, multiple-output circuits are processed by processing each primary output and its fanin logic separately. The algorithm for identifying primitive faults of cardinality 2 consists of two parts. First, we collect the information about the co-sensitizing gates and FS paths that need to be tested. This part of the algorithm involves several steps.

1. Identify the co-sensitizing gates with respect to the given PO. This requires knowledge about the number of FS paths passing through each signal. One way to find this number is by using a known technique. This technique gives the upper bound on the number of cv-FS and ncv-FS paths through each signal. Therefore, the number of co-sensitizing gates is also an upper bound.

2. Account for some of the correlations between the cv-FS paths that pass through a given co-sensitizing gate by assigning a ncv→cv transition to both of its inputs and by checking for conflicts during the implication process (see Section 4.2).

3. For each FS path, further refine the information about co-sensitizing gates, i.e., we find the co-sensitizing gates for the target FS path. If there are no co-sensitizing gates on the target path, the target path does not have to be tested. Then, update the number of cv-FS and ncv-FS paths for all the signals on this FS path (see Section 4.3). To reduce the test generation effort, this step can be repeated several times.

Second, use the knowledge about co-sensitizing gates to find primitive faults of cardinality 2 for each FS path. A necessary condition for the existence of a primitive fault of cardinality 2 for an FS path P is that there exists at least one co-sensitizing gate in P. Find the primitive faults of cardinality 2 for an FS path P as follows:

1. Identify the co-sensitizing gates for P.

2. For a co-sensitizing gate $g \in P$, assign ncv→cv transition to the on-input m and to one additional input n to gate g (the number of cv-FS paths through n should be non-zero). All off-inputs feeding the co-sensitizing gates in P other than the off-input n are assigned a non-controlling value under vector $v_2$. This is to prevent the cardinality of the primitive fault from exceeding 2.

3. Explore the partial paths from n to any primary input PI in order to find a co-sensitizing path that together with P forms a primitive fault of cardinality 2. The partial path from n to the given PI must be (1) statically sensitizable under the current SMA and (2) contained in some FS path. Use the strategy as published in Delay Testing For Non-Robust Untestable Circuits, Proceedings of IEEE International Test Conference, pages 954–961, October 1993, to quickly identify segments in the input cone of signal n for which, under the current SMA, no static sensitizable path can pass through. Also, in this step use the information about the number of cv-FS and ncv-FS paths passing through each signal to reduce or prune the search for the partial path. Once a partial path to PI is found, check if the path co-sensitized with P at gate g is functional sensitizable. If yes, a primitive fault of cardinality 2 is found. The search continues until all statically sensitizable partial paths from n to any PI are found.

4. Repeat steps 1, 2 and 3 for any input n feeding any co-sensitizing gate $g \in P$, which means that gate g is one gate in path P.

Figure 8A:
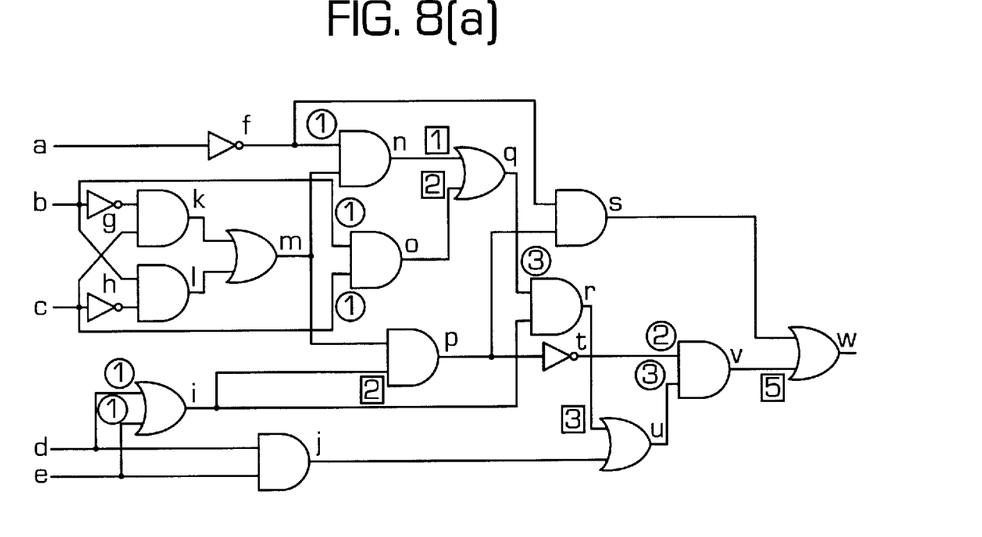
FIG. 8 is a circuit which illustrates the second part of an algorithm in which the circled numbers in FIG. 8(a) show the number of cv-FS paths passing through the given edge while the numbers inside the boxes show the number of ncv-FS paths, wherein the circuit in FIG. 8(b) find all primitive cardinality 2 be the path of the target path P.
Figure 8B:
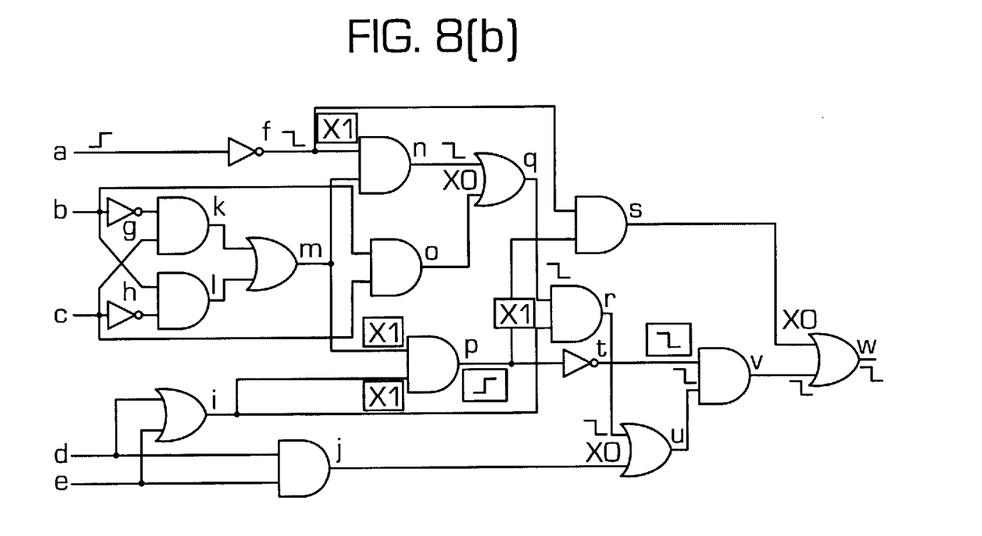

FIG. 8 is a circuit which illustrates the second part of the algorithm in which the circled numbers in FIG. 8(a) show the number of cv-FS paths passing through the given edge while the numbers inside the boxes show the number of ncv-FS paths. The values are shown only for those signals for which the number of cv- or ncv-FS paths is non-zero. Gates i, o and v are the co-sensitizing gates with respect to the primary output w. Let the target path P for which we are trying to find all primitive faults of cardinality 2 be the path shown in bold face in FIG. 8(b). The SMA for P is also shown in the Figure (ignore for now the values shown inside the boxes since they are not part of the SMA for P). The only co-sensitizing gate on P is gate v. To find a co-sensitized path which together with path P forms a primitive fault of cardinality 2, only partial paths associated with off-input t have to be explored. Note that, if we did not use the information about co-sensitizing gates, we would have to explore all the partial paths associated with off-inputs i, m and t (potential FS off-inputs in the target path). Next, assign a non-controlling value to all off-inputs to P other than off-input t and a ncv→cv transition to off-input t. These values are shown within small boxes in FIG. 8(b). Next, examine the partial paths from signal t to any primary input. The partial path associated with off-input t must be static sensitizable under the current SMA. Since the path co-sensitized with P has to be functional sensitizable, the search effort can be reduced by using the information about the number of cv-FS and ncv-FS paths passing through each signal. For example, there are no ncv-FS paths through input m to gate p and the output of p is assigned 1 under vector $v_2$. Therefore, we can eliminate from further consideration all partial paths passing through signal m. On the other hand, input i to gate p has 2 ncv-FS paths passing through it and we have to continue checking all paths passing through signal i. Once a partial path is identified, check if the path co-sensitized with P is functional sensitizable. In the example there are two primitive faults of cardinality 2 containing path P: one contains paths P and {diptvw, rising} and the other contains P and {eiptvw, rising}.

4.5 Primitive faults of cardinality k>2

This section discusses some of the necessary conditions for an FS path to be involved in a primitive fault of cardinality k>2.

In addition to being related to a primary output PO and a target path, the information about co-sensitizing gates can also be related to the cardinality of a primitive fault. A given gate can be a co-sensitizing gate with respect to primitive faults of cardinality equal or less than k but a non-co-sensitizing gate with respect to primitive faults of cardinality higher than k. To find the primitive faults of cardinality k, the primitive faults of cardinality k−1 have to be found first.

Let cv_FS(i) denote the number of cv-FS paths passing through signal i and let $N_{ub}(g,k)$ denote the upper bound on the number of primitive faults of cardinality k for which gate g is a merging point. Using the information about cv_FS(i) for each input to a co-sensitizing gate g, $N_{ub}(g,k)$ can be found as follows. It is the number of different ways one can choose k paths such that not all of them pass through the same input of g. For example, let gate g have two inputs (a and b) and let cv_FS(a)=3 and cv_FS(b) =2. Then, we have $N_{ub}(g,2)=3\times2=6$, $N_{ub}(g,3)=3\times2+1\times3=9$, $N_{ub}(g,4)=1\times2+3\times1=5$, $N_{ub}(g,5)=1\times1=1$, while the number of possible primitive faults for cardinality 6 or higher is equal to 0. Number $N_{ub}(g,k)$ represents an upper bound which might not be tight for two reasons. First reason is the inability to precisely compute the number of cv-FS paths passing through each signal, the inability to find all the FS paths that are not required to be tested and ignoring the path correlations. The second reason is that gate g might participate as a merging point in some primitive faults of cardinality higher than k. Let $N_{identified}(g,k)$ denote the number of identified primitive faults of cardinality k such that gate g is a merging point. If for a given co-sensitizing gate g and given cardinality k we have $N_{identified}(g,k)=N_{ub}(g,k)$ according to the definition of a primitive fault, gate g cannot be a co-sensitizing gate for any primitive fault of cardinality higher than k. Therefore, with respect to primitive faults of cardinality equal or higher than k+1, gate g is a non-co-sensitizing gate. On the other hand, if $N_{identified}(g,k)<N_{ub}(g,k)$, then gate g should be considered as a co-sensitizing gate with respect to primitive faults of cardinality k+1.

Figure 7:
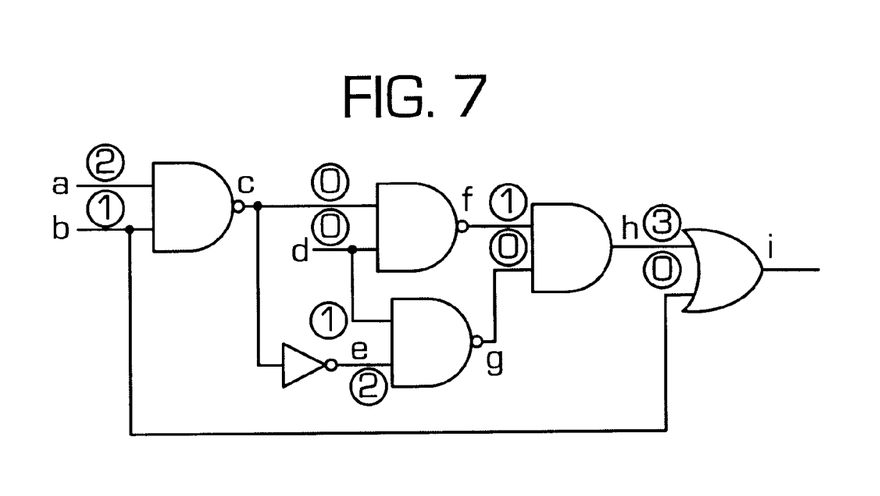
FIG. 7 is an exemplary circuit which illustrates that by using the information about FS paths which do not require testing, the number of cv-FS paths through each signal can be updated, and in FIG. 7 the updated values for cv-FS paths are shown as circled numbers adjacent to each signal.

Cardinality of a co-sensitizing gate is defined as the sum of the number of cv-FS paths passing through the inputs to this gate. For example, the cardinality of a co-sensitizing gate g in FIG. 7 is 2+1=3. By definition, cardinality of any co-sensitizing gate must be higher or equal 2.

The following Lemma gives the necessary condition for existence of a primitive fault of cardinality k>2 for an FS path P. The condition is based on the cardinality of co-sensitizing gates on P and on the number of primitive faults of cardinality lower than k.

Lemma 1 A necessary condition for the existence of a primitive fault of cardinality k>2 that includes FS path P is that there exists at least one co-sensitizing gate g in P such that (1) $C(g)\geq k$ and (2) $N_{identified}(g,k)<N_{ub}(g,k)$ ((1) the cardinality of the co-sensitizing gate is higher than or equal to k and (2) gate g is a co-sensitizing gate with respect to primitive faults of cardinality k).

Note that a gate g can be a co-sensitizing gate for a primitive fault of cardinality k even if $C(g)<k$. However, there must exist some gate f in the fanout cone of g such that $C(f)\geq k$.

This condition is illustrated for k=3. To find the primitive faults of cardinality 3 we use the information about the number of primitive faults of cardinality 2 at each co-sensitizing gate. Based on Lemma 1, the necessary conditions for existence of a primitive fault of cardinality 3 for some FS paths are that (1) there exists at least one co-sensitizing gate g of cardinality equal or higher than 3 and (2) gate g is a co-sensitizing gate with respect to primitive faults of cardinality 3. (The second condition means that the number of primitive faults of cardinality 2 at g is not equal to the upper bound on this number for gate g.) For example, consider again the circuit in FIG. 7. Let the target path be P={bceghi, falling}. Gates c and g are the co-sensitizing gates for the target path. To check if for P there might exist some primitive fault of cardinality 3, first find all the primitive faults of cardinality 2 in the circuit. For gates c and g we have $N_{ub}(c,2)=2$, $N_{ub}(g,2)=2$, $C(c)=3$ and $C(g)=3$. It can be shown that there is only one primitive fault of cardinality 2 in this circuit and it contains paths {bceghi, falling} and {dghi, falling}. The only merging point is gate g. Therefore, we have $N_{identified}(c,2)=0$ and $N_{identified}(c,2)=1$ This means that both gates are classified as co-sensitizing gates with respect to primitive faults of cardinality 3. Therefore, the condition from Lemma 1 is satisfied for path P. Therefore, the number of primitive faults of cardinality 2 at gate c is 0 and the number of primitive faults of cardinality 2 at g is 1. The upper bound on the number of primitive faults of cardinality 2 at both of these gates is $2\times1=2$. Since, the cardinality of each co-sensitizing gate in this circuit is 3, the condition from Lemma 1 is satisfied.

4.6 Test set compaction

For any primitive fault Π the same test is produced if any one of the single-delay faults in Π is selected as a target fault. Therefore, not all of the FS paths have to be selected for testing. It is sufficient to select a set of FS paths such that all possible primitive faults are covered. Reduction of the set of FS paths that are selected for testing automatically reduces the test generation effort, the test set size and test application time. Known techniques as published by Sparmann, et al., Fast Identification of Robust Dependent Path Delay Faults, Proceedings of 32nd Design Automation Conference, pages 119–125, June 1995, can be used to select a subset of FS paths such that testing these FS paths can guarantee that all primitive faults will be covered. The technique of the present invention can be easily combined with the published technique.

Figure 9:
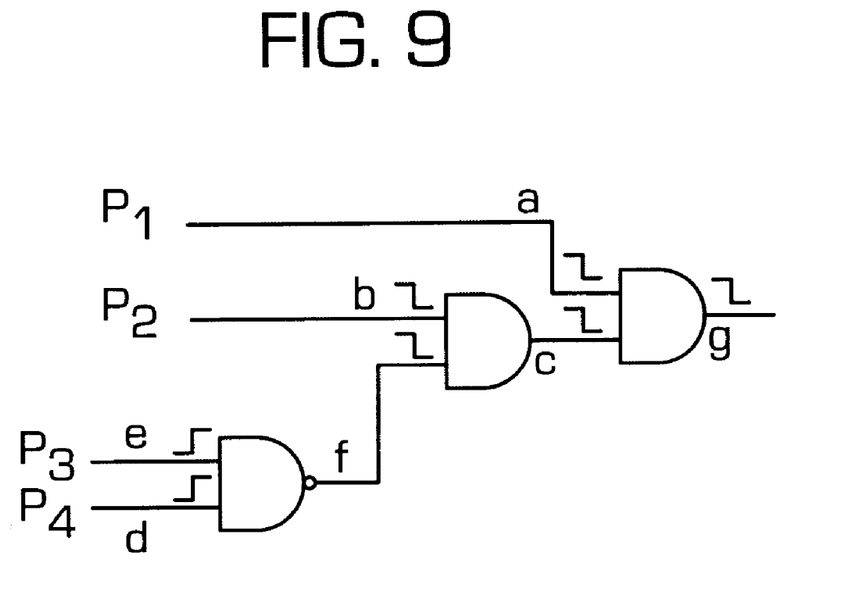
FIG. 9 is an exemplary circuit which illustrates that although there could be many primitive faults for a given path, the test set does not have to be large, and that one can take advantage of the circuit structure to concurrently test several primitive faults.

Although there could be many primitive faults for a given path, the test set does not have to be large. One can take advantage of the circuit structure to concurrently test several primitive faults. To illustrate this, assume that the logic shown in FIG. 9 is a part of some larger circuit. Let the transitions on signals under some input vector pair T be as shown. Also let there be, under test T, only one path through which the transition arrives to each of the inputs a, b, c and d and let these paths be $P_1$, $P_2$, $P_3$ and $P_4$ respectively. Assume that all these paths are functional sensitizable and that all of them are simultaneously faulty. Even though four FS paths are involved in a multiple delay fault tested

TABLE 1

Results for primitive faults of cardinality 2.

| | number of faults | | | max delay (ns) | | d | FS results total for del > d | need to be tested | no pf_2 | pf_2 | rates total | co-sens | cpu (s) |
|---|---|---|---|---|---|---|---|---|---|---|---|---|---|
| Ckt | total | FIRR | FS | % | R + NR | FS | (ns) | | | | | | | |
| como | 4032 | 2100 | 780 | 37 | 86 | 62 | 0 | 780 | 612 | 414 | 286 | 130 | 64 | 163 |
| ig | 73960 | 43252 | 20464 | 20 | 49 | 48 | 43 | 2295 | 2204 | 1884 | 448 | 1100 | 94 | 2057 |
| frr2 | 9584 | 9417 | 440 | 7 | 54 | 45 | 0 | 440 | 76 | 34 | 15 | 1486 | 33 | 256 |
| pair | 34938 | 29345 | 6851 | 23 | 91 | 88 | 0 | 6551 | 6574 | 1834 | 6414 | 1596 | 280 | 3214 |
| term1 | 1298 | 1232 | 94 | 4 | 49 | 46 | 0 | 94 | 61 | 53 | 5 | 478 | 34 | 50 |
| vda | 10954 | 10954 | 1551 | 12 | 39 | 37 | 0 | 1251 | 1057 | 315 | 543 | 1300 | 278 | 1444 |
| C432 | 583652 | 208652 | 187240 | 90 | 96 | 98 | 96 | 752 | 752 | 728 | 28 | 212 | 70 | 6571 |
| C880 | 17264 | 17131 | 434 | 3 | 95 | 95 | 0 | 434 | 326 | 326 | 0 | 346 | 7 | 516 |

TABLE 1-continued

Results for primitive faults of cardinality 2.

| | number of faults | | | | max delay (ns) | | d | FS results | | | | rates | | cpu |
| | total | FIRR | FS | % | R + NR | FS | (ns) | total for del > d | need to be tested | no pf_2 | pf_2 | total | co-sens | (s) |
|---|---|---|---|---|---|---|---|---|---|---|---|---|---|---|
| Ckt | | | | | | | | | | | | | | |
| C5315 | 2682418 | 588788 | 229785 | 39 | 140 | 133 | 138 | 345 | 348 | 286 | 36 | 2109 | 9 | 382772 |
| C7552 | 1439986 | 442318 | 166012 | 38 | 114 | 114 | 110 | 610 | 493 | 448 | 22 | 2629 | 41 | 37054 |
| s344 | 710 | 618 | 231 | 37 | 51 | 50 | 0 | 231 | 101 | 67 | 112 | 109 | 35 | 27 |
| s420 | 726 | 738 | 47 | 6 | 65 | 29 | 0 | 47 | 30 | 0 | 41 | 141 | 11 | 2 |
| s444 | 1066 | 733 | 227 | 81 | 49 | 46 | 0 | 227 | 198 | 63 | 248 | 169 | 58 | 35 |
| s510 | 736 | 662 | 190 | 29 | 41 | 22 | 0 | 190 | 116 | 88 | 20 | 215 | 54 | 27 |
| s635 | 2490 | 1277 | 1211 | 95 | 17 | 109 | 0 | 1211 | 1211 | 67 | 2154 | 190 | 157 | 273 |
| s836 | 3428 | 2756 | 568 | 32 | 64 | 64 | 0 | 888 | 871 | 616 | 259 | 341 | 169 | 168 |
| s1196 | 6194 | 5388 | 1592 | 30 | 70 | 72 | 0 | 1592 | 1084 | 727 | 373 | 488 | 147 | 420 |
| s1238 | 7116 | 6092 | 2324 | 58 | 81 | 82 | 0 | 2334 | 1766 | 1160 | 654 | 642 | 206 | 623 |
| s1269 | 79138 | 16506 | 17506 | 95 | 43 | 105 | 0 | 17505 | 17504 | 17218 | 511 | 479 | 201 | 1735 |
| s1423 | 89482 | 72368 | 62545 | 86 | 237 | 211 | 0 | 62543 | 24372 | 19167 | 38694 | 507 | 146 | 10077 |
| s1488 | 1924 | 1672 | 366 | 20 | 50 | 50 | 0 | 366 | 166 | 108 | 39 | 736 | 69 | 92 |
| s1512 | 6836 | 2881 | 2769 | 96 | 43 | 83 | 0 | 2759 | 2670 | 2480 | 160 | 485 | 321 | 226 |
| s3271 | 38356 | 9118 | 6296 | 69 | 83 | 82 | 0 | 6296 | 5031 | 3912 | 3241 | 1150 | 375 | 1172 | by T, only three of them have to be simultaneously faulty for test T to detect the fault. Therefore, test T concurrently tests two primitive faults of cardinality 3: $II_1=\{P_1, P_2, P_3\}$ and $II_2=\{P_1, P_2, P_4\}$. Hence, assigning two rising transitions at inputs c and d as opposed to one rising transition and one stable 1 value can reduce the test set size.

Experimental Results

The algorithm has been implemented for identifying and testing primitive faults of cardinality 2. Table 1 reports the experimental results. Column total gives the total number of faults in the circuit. Column FIRR shows the number of functional irredundant faults. The total number of FS faults and the percentage of FS paths with respect to the functional irredundant paths are given under columns FS and %, respectively. The next two columns show the delay in nanoseconds for the longest robust or non-robust testable fault (column R+NR) and for the longest functional sensitizable path delay fault (column FS). For many circuits the FS paths represent a large portion of the functional irredundant set (up to 95.77%). The length of the longest FS path is either comparable or much longer than the length of the longest robust or non-robust fault (circuits s3271, s1512, s1269 and s635). For these circuits it is very likely that if a delay fault exists, it can be detected only by tests for primitive faults.

Table 1 also shows the results on the number of primitive faults of cardinality 2. For larger circuits we select for testing only a subset of long paths. Column d shows the specified time in nanoseconds for selecting FS paths for testing. Column total for del>d shows the number of FS paths longer than the specified time d, while the column need to be tested shows the number of FS paths longer than d and containing at least one co-sensitizing gate under the corresponding SMA. The technique as published in Delay Testing for Non-Robust Untestable Circuits, Proceedings of IEEE International Test Conference, pages 954–961, October 1993, is used to identify FS paths. It is based on the necessary condition which uses only mandatory assignments under vector $v_2$. Therefore, the number of identified FS paths could be larger than the actual number-some of the functional redundant paths could be misclassified as FS paths. Column no pf_2 shows the number of tested FS paths for which no primitive fault of cardinality 2 exists. These paths are either all involved in primitive faults are of cardinality higher than 2 or these paths are functionally redundant. The rest of the tested FS paths considered for testing have at least one primitive fault of cardinality 2. Column pf_2 shows the number of primitive faults of cardinality 2. For example, for C880 there are 434 FS paths and 326 have at least one co-sensitizing gate. However, none of these paths is involved in a primitive fault of cardinality 2. They are either functionally redundant or all primitive faults in this circuit are of cardinality higher than 2. As another example, circuit s1423 has a total of 62,343 FS paths and 24,372 of them need to be tested. Even though a large number of these paths do not participate in any primitive fault of cardinality 2, there is a very large number of primitive faults of cardinality 2 (38,694). For the large ISCAS 85 circuits, the results represent only the primitive faults of cardinality 2 in which both co-sensitized paths are longer than the specified cut-off time. Columns total and co-sens. show the number of 2 input gates in the circuit and the total number of co-sensitized gates for all FS paths, respectively. For example, for C880 there were 348 gates in the circuit and after testing 326 FS paths only 7 gates were identified as co-sensitizing gates for these paths. The CPU runtime (in seconds) required to identify and generate tests for primitive faults of cardinality 2 is shown under column cpu.

6 Conclusions

Ignoring some multiple path delay defects in the process of test generation can lead to a poor delay test quality. This is unlike the stuck-at fault model where tests for single faults can ensure high multiple fault coverage. It is very difficult to identify and test all multiple path delay faults that have to be tested (primitive faults) to guarantee the timing correctness of the shipped circuits. We present a method that can reduce the complexity of the problem by eliminating from consideration a large number of gates and signals during the search for primitive faults. The chance that a circuit has a primitive fault that includes many paths decreases dramatically as the number of involved paths increases. Therefore, identifying and testing of primitive faults involving a small number of paths is of the highest significance. The present invention presents a complete method to identify and test primitive faults of cardinality 2. The experimental results show that the procedure is practical for ISCAS benchmark examples. We also derive necessary conditions, based on the logic structure of the circuit, for the existence of primitive faults of higher cardinality. The outcome of applying our test set in addition to the test set for robust and non-robust faults, is guaranteed detection of the presence of any delay defect that can affect one or two paths. We also derive necessary conditions, based on the logic structure of the circuit, for the existence of primitive faults of higher cardinality. Finding additional conditions for identification and testing of primitive faults of higher cardinality would result in a complete testing strategy for all path delay faults that can affect the circuit performance.

While several embodiments and variations of the present invention for a method for identification and test generation for primitive faults are described in detail herein, it should be apparent that the disclosure and teachings of the present invention will suggest many alternative designs to those skilled in the art.

What is claimed is:

1. A method for identifying and testing primitive faults occurring in a combinational circuit, said combinational circuit comprising a plurality of gates, said circuit having a plurality of paths through said plurality of gates, a subset of said paths being functional senzitizable paths, a further subset of said subset of functional sensitizable paths being controlling-value functional senzitizable paths, said method comprising the steps of:

a) identifying a subset of gates in the combinational circuit wherein said subset of gates do not have paths involved in any primitive fault merge, said identifying being performed by using information about a number of the functional sensitizable paths that go through each of said plurality of gates in the circuit;

b) examining each of said subset of functional sensitizable paths (FS) and determining primitive faults which include said each of said functional sensitizable paths;

c) updating said further subset of controlling value-functional sensitizable (cv-FS) paths through each gate by eliminating from testing a second subset of paths wherein said second subset of paths do not have any co-sensitizing gate, wherein said updating is done by using information about functional paths which do not require testing; and d) repeating step c through multiple iterations.

2. A method as claimed in claim 1, wherein:

for finding a co-sensitized path which together with any path in the combinational circuit form a primitive fault with a cardinality value of 2, only partial paths in the combinational circuit associated with an off-input are explored, and a non-controlling value is assigned to all other off-inputs on said any path forming the primitive fault other than said explored off-input and a transition from non-controlling value to controlling value is assigned to said explored off-input, wherein said explored off-input to said any path forming the primitive fault is any input of said gates in said any path forming the primitive fault wherein said any input is not on said any path forming the primitive fault.

3. The method of claim 1, wherein for a primitive fault with a cardinality value of k>2, if a number of said further subset of controlling value functional senzitizable paths through each input of a co-sensitizing gate is known, then an upper bound is derived, wherein said upper bound is a limit on a number of primitive faults with a cardinality value of k such that said co-senzitizing gate is a merging point.

4. The method of claim 1, wherein a necessary condition for the existence of a primitive fault with a cardinality value of k>2 that includes one of said functional senzitizable paths is that there at least one of said co-sensitizing gates in said one of said functional senzitizable paths satisfies a first condition and a second condition, said first condition being that a cardinality of said at least on of said co-sensitizing gates is higher than or equal to k, and said second condition being that said at least one of said co-sensitizing gates is with respect to a subset of primitive faults with a cardinality value of k.

5. A method as claimed in claim 1, wherein prior to determining the primitive faults with a cardinality value of k, primitive faults with a cardinality value of k−1 is determined.

6. The method of claim 5, wherein for determining the primitive faults with a cardinality value of k, information about a number of primitive faults with a cardinality value of k−1 at said each of said co-sensitizing gates is used, wherein a necessary condition for the existence of a primitive fault with a cardinality value of k>2 that includes one of said functional senzitizable paths is that there at least one of said co-sensitizing gates in said one of said functional senzitizable paths satisfies a first condition and a second condition, said first condition being that a cardinality of said at least on of said co-sensitizing gates is higher than or equal to k, and said second condition being that said at least one of said co-sensitizing gates is with respect to a subset of primitive faults with a cardinality value of k.

7. The method of claim 1, wherein:

a delay defect on any of said plurality of paths is observed by propagating a transition through said any of said plurality of paths, which requires application of a two-vector test $V=(v_1, v_2)$, and primitive faults with a cardinality value of 2 are identified by collecting information about a test-subset of the co-sensitizing gates and a test-subset of said subset of functional sensitizable paths which need to be tested, wherein identifying of said primitive faults with a cardinality value of 2 is done by a method further comprising the steps of:

i) identifying a PO-subset of said co-sensitizing gates with respect to a primary output, using knowledge about a number of functional sensitizable paths passing through each gate, wherein said identifying produces an upper bound on a number of controlling value functional senzitizable paths and an upper bound on a number of non-controlling value functional senzitizable paths through said each gate;

ii) further refining the information about co-sensitizing gates for each of said subset of functional senzitizable paths by finding a subset of co-sensitizing gates for the test-subset of functional senzitizable paths;

iii) finding a not-test-subset of said subset of functional senzitizable paths which do not have comprise any co-sensitizing gates and do not need to be tested, and a number of controlling value functional senzitizable and a non-controlling value functional sensitizable paths through said each gate in the combinational circuit; and iv) reducing a test set size by repeating steps i–iii through several iterations.

8. The method of claim 7, further comprising:

e) using the knowledge about co-sensitizing gates to find primitive faults with a cardinality value of 2 for each said subset of functional sensitizable paths, wherein a necessary condition for the existence of a primitive fault with a cardinality value of 2 for said each said subset of functional sensitizable paths is that there exists at least one co-sensitizing gate in said each said subset of functional sensitizable paths, and f) said finding the primitive faults in step e being done using a method comprising the steps of:
  i) identifying co-sensitizing gates for each said subset of functional sensitizable paths;
  ii) assigning non-controlling value-controlling value transition to an on-input m and to one additional off-input n to said co-senstizinng gates in step i, wherein a number of controlling value functional sensitizable paths through n is non-zero, all off-inputs feeding the subset of co-sensitizing gates in said each said subset of functional sensitizable paths other than the off-input n are assigned a non-controlling value under vector $v_2$, to prevent the cardinality of the primitive fault from exceeding 2;
  iii) exploring partial paths from n to any primary input of the combinational circuit to find a co-sensitizing path that together with said each of said subset of functional sensitizable paths forms a primitive fault with a cardinality value of 2, wherein said partial paths from n to said any primary input must be statically sensitizable under a current set of mandatory assignments (SMA) and part of any of said subset of functional sensitizable paths;
  iv) identifying segments in the input cone of signal n for which, under the current SMA, no static sensitizable path can pass through;
  v) reducing a search for the partial paths using the information about the number of the controlling value functional sensitizable paths and non-controlling value functional sensitizable paths passing through each signal, once a partial path to the primary input is found;
  vi) checking if a path corresponding to step i is functional sensitizable, if the check is true, a primitive fault with a cardinality value of 2 is found, and the search continues until all statically sensitizable partial paths from n to any primary input are found; and
  vii) repeating steps i–vi for all inputs feeding all the co-sensitizing gates in said each of said subset of functional sensitizable paths.

* * * * *